United States Patent
Shiomi et al.

(10) Patent No.: US 6,660,084 B1
(45) Date of Patent: Dec. 9, 2003

(54) SIC SINGLE CRYSTAL AND METHOD FOR GROWING THE SAME

(75) Inventors: Hiromu Shiomi, Suita (JP); Tsunenobu Kimoto, Kyoto (JP); Hiroyuki Matsunami, Yawata (JP)

(73) Assignees: Sixon, Inc., Kyoto (JP); Kansai Electric Power C.C., Inc., Osaka (JP); Mitsubishi Corporation, Tokyo (JP)

( * ) Notice: Subject to any disclaimer, the term of this patent is extended or adjusted under 35 U.S.C. 154(b) by 0 days.

(21) Appl. No.: 10/069,503
(22) PCT Filed: Sep. 6, 2000
(86) PCT No.: PCT/JP00/06054
§ 371 (c)(1), (2), (4) Date: Feb. 27, 2002
(87) PCT Pub. No.: WO01/18286
PCT Pub. Date: Mar. 15, 2001

(30) Foreign Application Priority Data

Sep. 6, 1999 (JP) ............................................. 11-251572

(51) Int. Cl.[7] .......................... C30B 25/02; C30B 25/04
(52) U.S. Cl. ........................... 117/104; 117/84; 117/88; 117/89
(58) Field of Search ............................... 117/84, 88, 89, 117/105

(56) References Cited

U.S. PATENT DOCUMENTS 6,063,185 A * 5/2000 Hunter ........................ 117/84

FOREIGN PATENT DOCUMENTS

| JP | 59-035099 | 2/1984 |
|----|-----------|--------|
| JP | 02-030699 | 2/1990 |
| JP | 4-16597 | 1/1992 |
| JP | 04-016597 | 1/1992 |
| JP | 05-262599 | 10/1993 |
| JP | 7-267795 | 2/1996 |

OTHER PUBLICATIONS

Z.Y. Chen, et al., "Specular Surface Morphology of 4H–SiC Epilayers Grown on (1120) Face", Jpn. J. Appl. Phys., vol. 38, Part 2, No. 12A, Dec. 1, 1999, pp. L1375–L1378.

J. Takahashi and N. Ohtani: Modified–Lely SiC Crystals phys. stat. sol. (b) 202, 163–175, (1997) Subject classification: 61.72.Nn; 61.72.Ff; S6 Modified–Lely SiC Crystals Grown in (1100) and (1120) Directions J. Takahashi and N. Ohtani, Advanced Technology Reserach Laboratories, Nippon Steel Corporation, 5–10–1 Fuchinobe, Sagamihara, Kanagawa 229, Japan.

Z.Y. Chen, et al. "*Specular Surface Morphology of 4H–SiC Epilayers Grown on (1120) Face*" Jpn. J. Appl. Phys., vol. 38, Part 2, No. 12A, Dec. 1, 1999, pp. L1375–L1378.

* cited by examiner

*Primary Examiner*—Felisa Hiteshew
(74) *Attorney, Agent, or Firm*—McDermott, Will & Emery

(57) ABSTRACT

A method of growing a 4H-poly type SiC single crystal 40, characterized in that the 4H-poly type SiC single crystal 40 is grown on a seed crystal 30 comprised of an SiC single crystal where a {03-38} plane 30$u$ or a plane which is inclined at off angle α, within about 10°, with respect to the {03-38} plane, is exposed.

7 Claims, 4 Drawing Sheets

SIC SINGLE CRYSTAL AND METHOD FOR GROWING THE SAME

TECHNICAL FIELD

The present invention relates to an SiC single crystal suitable for semiconductor electronic components and a growth method thereof, and more particularly to a 4H poly type SiC single crystal and a growth method thereof.

BACKGROUND ART

Current research on a compound semiconductor comprised of such light elements as silicon carbide (SiC) or gallium nitride (GaN) is active. Such a compound semiconductor which is comprised of light elements has a feature where the bonding energy is strong, and as a result the band gap of energy, dielectric breakdown electric field and thermal conductivity are high. SiC in particular is attracting attention as a material for high efficiency high withstand voltage power devices, high frequency power devices, high temperature operation devices or blue to purple light emitting devices, because of this wide band gap feature. However, because of its strong bonding energy, an SiC compound does not melt in atmospheric temperature, and has difficulty in growing bulk crystals by recrystallizing the melt which is performed with other semiconductors, including silicon (Si).

A known method of growing a bulk SiC single crystal is the so called improved Raleigh method described in Japanese Patent Publication No. S59-48792 and Japanese Patent Laid-Open No. H2-30699. In this improved Raleigh method, a seed crystal comprised of SiC single crystals is set in a crucible made of graphite, material SiC powder is sublimated in a lower pressure atmosphere, and a target scale SiC single crystal is recrystallized on the seed crystal.

In a so called sublimation method, including this improved Raleigh method, mainly an SiC single crystal substrate where the {0001} plane is exposed is used as the seed crystal. However, if an SiC single crystal is grown using an SiC single crystal substrate where the plane orientation is {0001}, a defect called a micro-pipe, which extends in the <0001> axis direction, reaches the surface of the single crystal, so in some cases a leak current is generated when a device is fabricated using the SiC single crystal.

A known technology to solve the problem related to a micro-pipe is a method of growing an SiC single crystal described in Patent Publication No. 2804860, for example. In this method, an SiC single crystal, in which the crystal plane which is shifted through an angle α in a 60°–120° range from the {0001} plane, is used as a seed crystal, and preferably an SiC single crystal, in which a {1-100} plane or {11-20} plane is exposed, is used. If such a seed crystal is used, the micro-pipe reaching the surface of the single crystal can be decreased.

DISCLOSURE OF THE INVENTION

The method of growing an SiC single crystal described in Patent Publication No. 2804860 has the following problem. As the inventors of the invention described in Physical Status Solids (b) (No. 202, pp. 163–175, 1997), when an SiC single crystal where the {1-100} plane or {11-20} plane is exposed is used as a seed crystal, crystal polymorphy can be suppressed, and a micro-pipe reaching the surface can be suppressed, but a high density stacking fault is exposed on the surface of the SiC single crystal. This stacking fault spreads on the plane when the crystal is grown, and if a device is fabricated using such an SiC single crystal where a stacking fault is exposed on the surface, a leak current may be generated, just like the case of using an SiC single crystal where a micro-pipe exposed on the surface is used.

With the foregoing in view, it is an object of the present invention to provide an SiC single crystal where a micro-pipe and stacking fault exposed on the surface is decreased, and a growth method thereof.

The present invention is a method of growing a 4H poly type SiC single crystal, characterized in that a 4H poly type SiC single crystal is grown on a seed crystal comprised of an SiC single crystal where a {03-38} plane or a plane which is inclined at off angle α within about 10° from the {03-38} plane is exposed. In the method of growing an SiC single crystal according to the present invention, if a seed crystal where the {03-38} plane is exposed is used, for example, the exposed plane of the seed crystal has about a 35° inclination with respect to the <0001> orientation where micro-pipes extend. Therefore, if a 4H poly type SiC single crystal is grown on the seed crystal, micro-pipes can reach a side face of the SiC single crystal and the state for micro-pipes to reach the surface can be suppressed. Also the exposed plane of the seed crystal ({03-38} plane) has about a 55° inclination with respect to the plane perpendicular to the <0001> orientation where stacking faults spread, so if a 4H poly type SiC single crystal is grown on such a seed crystal, stacking faults can reach a side face of the SiC single crystal and the state for stacking faults to reach the surface can be suppressed. The exposed plane of the seed crystal may be a plane where off angle α within about 10° is inclined from the {03-38} plane, instead of the {03-38} plane, to suppress the state for micro-pipes and stacking faults to reach the surface of the grown SiC single crystal.

Off angle α is preferably 5°. And off angle α is even more preferred to be within 3°. In other words, as the surface of the seed crystal becomes closer to the {03-38} plane, the more certain of micro-pipes and stacking faults of reaching the surface can be suppressed.

The SiC single crystal may be grown on the seed crystal by a chemical vapor deposition method.

Another method of growing an SiC single crystal according to the present invention is a method of growing an SiC single crystal for recrystallizing a 4H poly type SiC single crystal on a seed crystal placed in a crucible by sublimating SiC material powder in a crucible made of graphite, characterized in that an SiC single crystal, where a {03-38} plane or a plane which is inclined at off angle α within about 10° from the {03-38} plane is exposed, is used as said seed crystal.

According to such a method of growing an SiC single crystal, if an exposed plane of the seed crystal to be placed in the crucible made of graphite is the {03-38} plane, for example, the exposed plane of the seed crystal has about a 35° inclination with respect to the <0001> orientation to which micro-pipes extend. So if a 4H poly type SiC single crystal is grown on such a seed crystal by sublimating SiC material powder, micro-pipes reach a side face of the SiC single crystal and the state for micro-pipes to reach the surface can be suppressed. Also the exposed plane of the seed crystal ({03-38}) plane has about a 55° inclination with respect to the plane perpendicular to the <0001> orientation where the stacking faults spread, so if a 4H poly type SiC single crystal is grown on such a seed crystal, the stacking faults can reach the side face of the SiC single crystal and the state for stacking faults to reach the surface can be suppressed. The exposed plane of the seed crystal may be a plane where off angle α within about 10° is inclined from the {03-38} plane, instead of the {03-38} plane, to suppress the state for micro-pipes and stacking faults to reach the surface of the grown SiC single crystal.

BEST MODE FOR CARRYING OUT THE INVENTION

Preferred embodiments of an SiC single crystal and the growth method thereof according to the present invention will now be described with reference to the accompanying drawings. Same elements are denoted with the same numbers, and redundant descriptions are omitted. In the description on the embodiments and examples, a lattice orientation and lattice plane of crystals are used. Now the symbols of the lattice orientation and lattice plane will be described. An individual orientation is indicated by [ ], a collective orientation is by < >, an individual plane is by ( ), and a collective plane is by { }. For a negative exponent, "−" (bar) is supposed to be positioned over a number in the crystallography, but in this description, a negative sign is positioned before a number.

Figure 1:
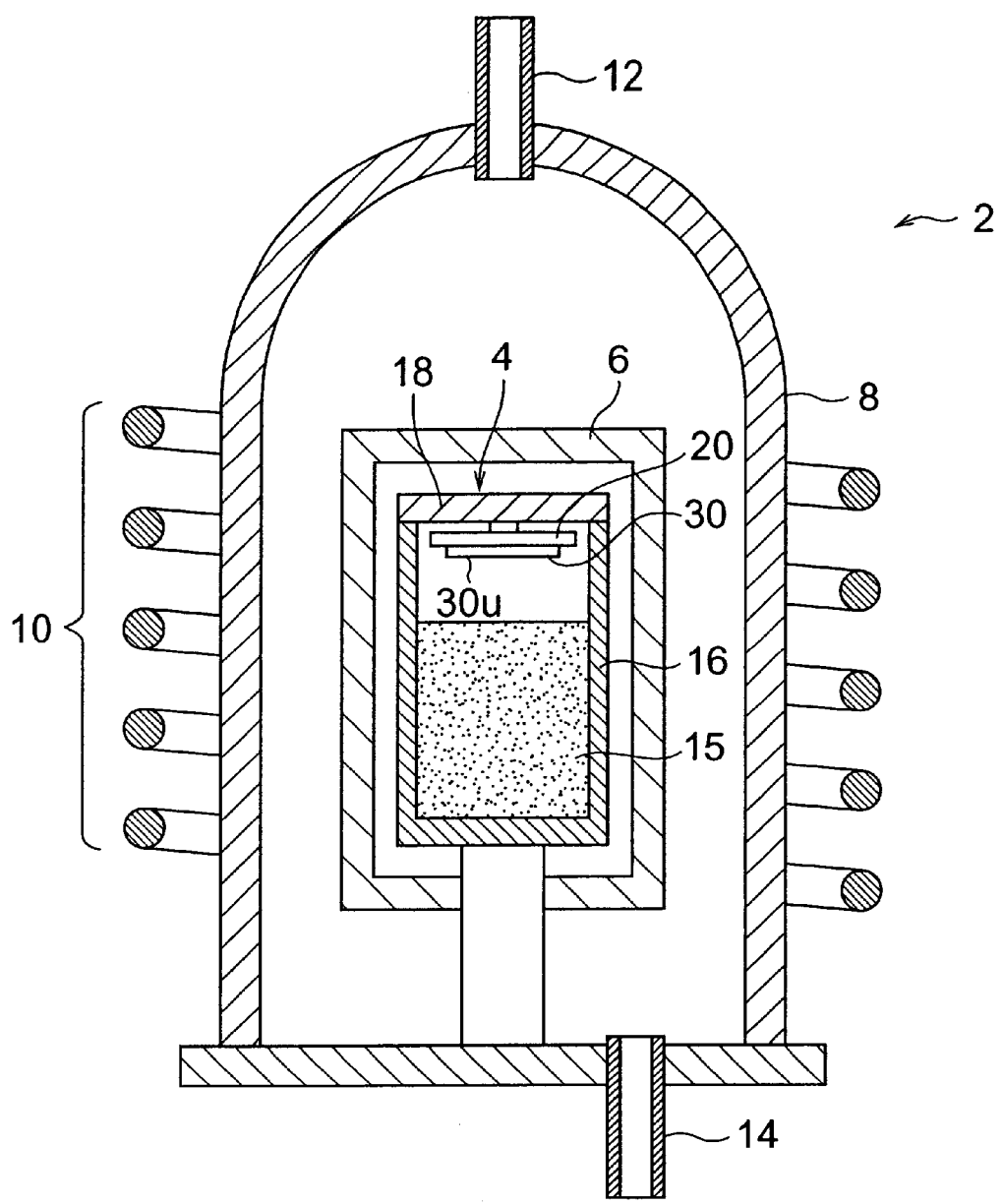
FIG. 1 is a cross-sectional view depicting a crystal growth system for growing an SiC single crystal of the present invention.

FIG. 1 is a cross-sectional view depicting a crystal growth system 2 for growing the SiC single crystal of the present embodiment. The crystal growth system 2 comprises a crucible 4 made of graphite where the SiC single crystal is grown inside, a heat shield element 6 for preventing heat of the crucible 4 from being discharged to the outside, a water-cooled reaction tube 8 surrounding the heat shield element 6, and a high frequency coil 10 which winds around the reaction tube 8 and is used for heating the crucible 4. At the top of the reaction tube 8, a gas supply tube 12 is inserted for supplying such inactive gas as argon gas, and at the base of the reaction tube 8, a gas exhaust tube 14 is inserted for exhausting the inactive gas to the outside.

The crucible 4 is comprised of a container part 16, which has a cylindrical shape with a base and contains material 15 comprised of an SiC poly-crystal, a cover part 18, which seals the top opening of the container part 16, and a seed crystal placement part 20, which is installed at the cover part 18 and where the seed crystal 30 is secured on the bottom face. In the present embodiment, 4H poly type ("H" refers to a hexagonal system and "4" refers to a crystal structure where one cycle is four stacks of atomic layers) SiC single crystal where the {03-38} plane is exposed is used for the seed crystal 30.

Figure 2:
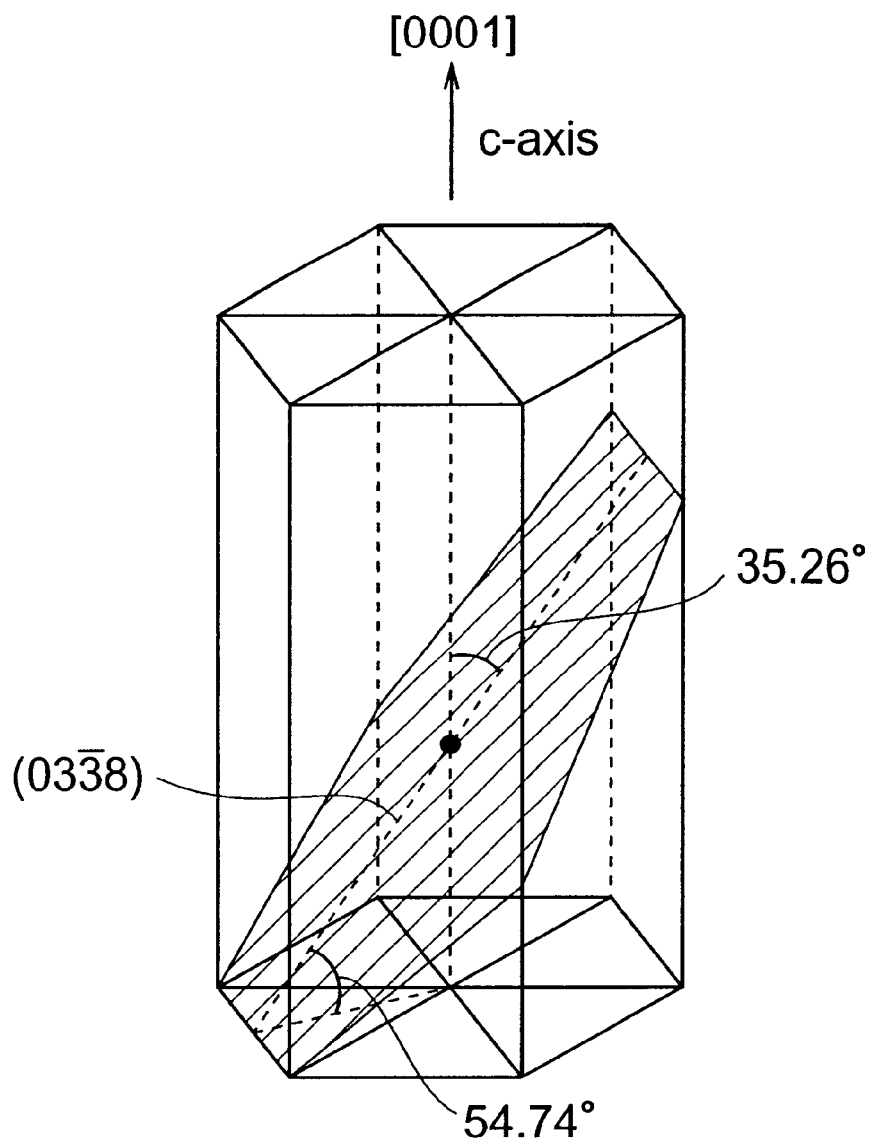
FIG. 2 is a diagram depicting the (03-38) plane of the SiC single crystal.

Now the (03-38) plane of the 4H-SiC single crystal will be described with reference to FIG. 2. As FIG. 2 shows, the (03-38) plane has about a 35° (35.26°) inclination with respect to the [0001] orientation, and has about a 55° (54.74°) inclination with respect to a plane perpendicular to the [0001] orientation.

Now a method of growing an SiC single crystal will be described with reference to FIG. 1–FIG. 4.

After placing a crucible 4 containing the material 15 and the seed crystal 30 in the reaction tube 8, the inside of the reaction tube 8 is evacuated for about one hour, then inactive gas is supplied from the gas supply tube 12 to set the pressure in the reaction tube 8 to be the normal pressure (760 Torr). After evacuating the inside of the reaction tube 8 for about 10 minutes, inactive gas is supplied from the gas supply tube 12 to set the pressure in the reaction tube 8 to be the normal pressure (760 Torr) again.

Figure 3:
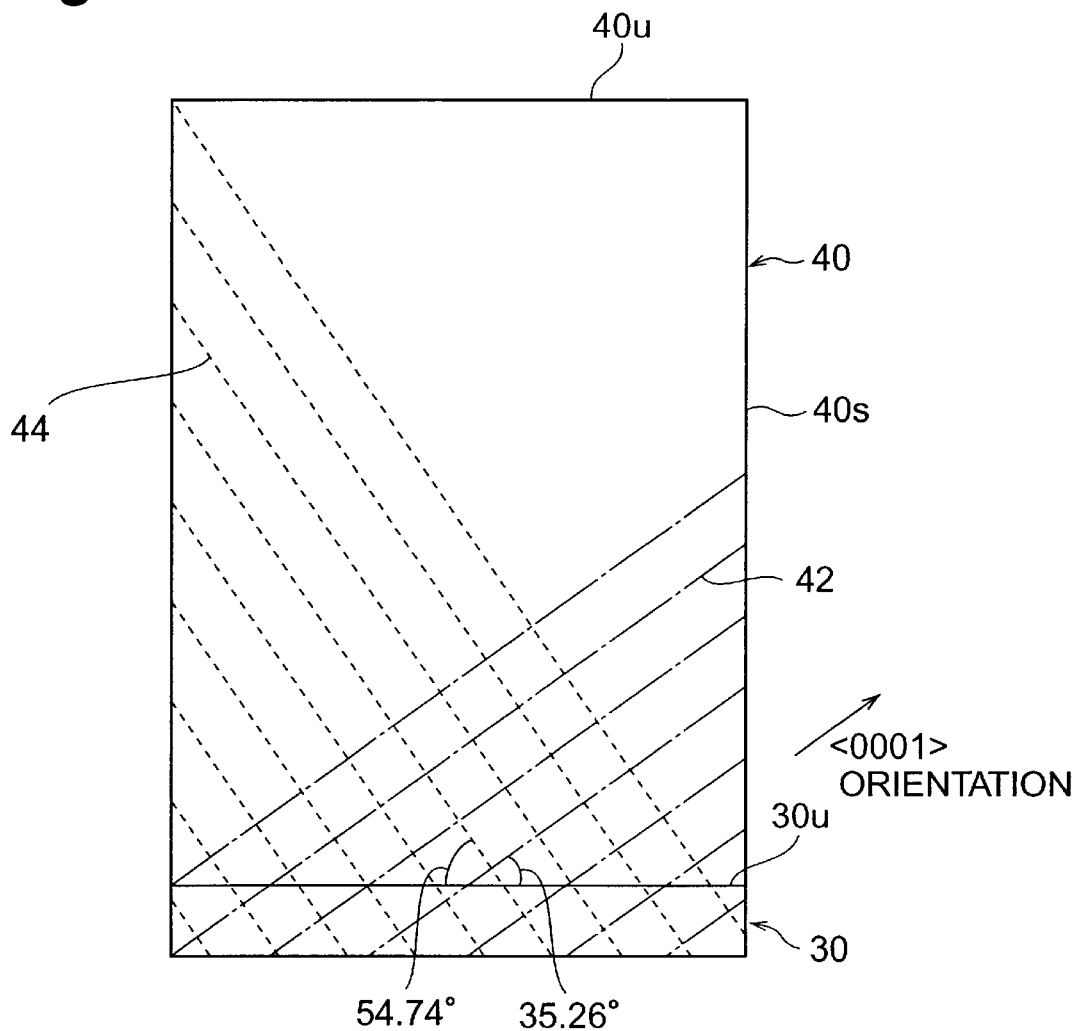
FIG. 3 is a diagram depicting the state of the micro-pipes and stacking faults in the SiC single crystal.

After the above operation ends, the crucible 4 is heated by the high frequency coil 10. At this time, the temperature of the crucible 4 is set to about 2000° C., and a temperature gradient is created so that the temperature of the seed crystal 30 is about 50° C. lower than the temperature of the material 15. At the same time, the pressure inside the reaction tube 8 is deceased to about 4 Torr. By this, the material 15 comprised of SiC poly-crystals is sublimated, the gas of the material 15 reaches the seed crystal 30, and the 4H poly type SiC single crystal 40 with about a 2 inch diameter can be grown on the surface (exposed plane) 30u of the seed crystal 30, as shown in FIG. 3. In FIG. 3, the SiC single crystal 40 is positioned above the seed crystal 30 to make the invention easier to understand, but actually the SiC single crystal 40 grows below the seed crystal 30, as shown in FIG. 1. The SiC single crystal may be grown on the seed crystal by a chemical vapor deposition method (CVD method) where such gas as silane or propane is supplied instead of the material 15.

Now the growth process of the SiC single crystal 40 will be described with reference to FIG. 3.

Normally when an SiC single crystal is grown, a micro-pipe which extends in the <0001> orientation and a stacking fault which spreads on a plane perpendicular to the <0001> orientation tend to be included inside the SiC single crystal. And if a device is fabricated using an SiC single crystal where many micro-pipes and stacking faults are exposed on the surface, leak current may be generated.

So if the seed crystal 30 where the {03-38} plane is exposed is used as shown in the present embodiment, the surface 30u of the seed crystal 30 has about a 35° inclination with respect to the <0001>orientation to which the micro-pipe 42 (shown by the dashed line in FIG. 3) extends. Therefore if the SiC single crystal 40 is grown to a certain extend, the micro-pipe 42 reaches the side face 40s of the SiC single crystal 40, and the state for the micro-pipe 42 to reach the surface 40u can be suppressed. The surface 30u of the seed crystal 30 has about a 55° inclination with respect to a plane where the stacking fault 44 (shown by the broken line in FIG. 3) spreads, that is, a plane perpendicular to the <0001> orientation. Therefore, if the SiC single crystal 40 is grown to a certain extent, the stacking fault 44 reaches the side face 40s of the SiC single crystal 40, and the state for the stacking fault 44 to reach the surface 40u can be suppressed.

Figure 4:
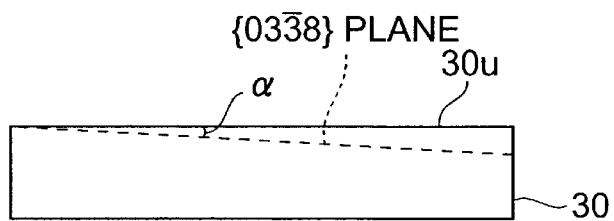
FIG. 4 is a diagram depicting a seed crystal where the surface is off angle α inclined from the {03-38} plane.

As FIG. 4 shows, the state for the micro-pipe 42 and stacking fault 44 to reach the surface 40u of the grown SiC single crystal 40 can be suppressed when the surface 30u of the seed crystal 30 is not the {03-38} plane of the embodiment but a plane which is off angle α within 10° inclined from the {03-38} plane. Off angle α is preferably within 5°, and it is more preferable to be within 3°. In other words, as the surface of the seed crystal becomes closer to the {03-38} plane, the state for the micro-pipe 42 and stacking fault 44 to reach the surface 40u of the SiC single crystal 40 can be suppressed with more certainty.

Figure 5:
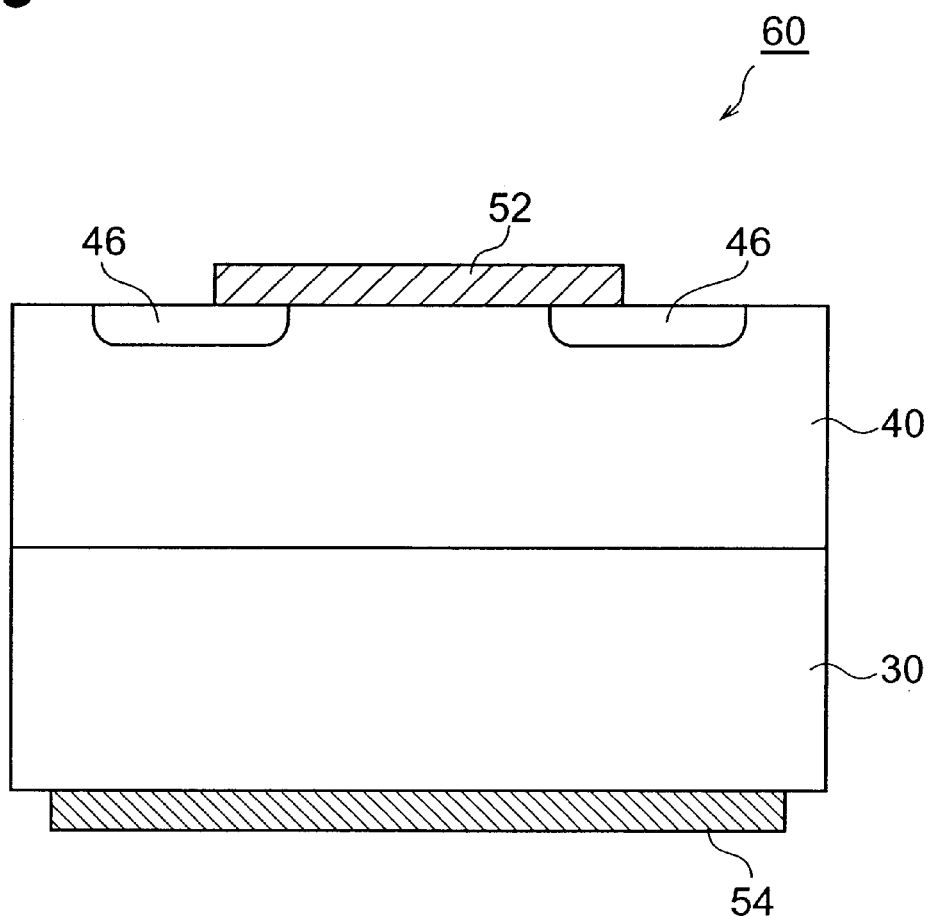
FIG. 5 is a cross-sectional view depicting a high withstand voltage diode fabricated using an SiC single crystal.

Various semiconductor devices can be fabricated using the SiC single crystal of the present invention. FIG. 5 is a cross-sectional view depicting a high withstand voltage diode 60 fabricated using the SiC single crystal of the present invention.

The diode 60 comprises an n-type SiC substrate 30 as a seed crystal, an n-type SiC active layer 40, a Schottky electrode 52 which is positioned on the top face of the SiC active layer 40, and an ohmic electrode 54 which is positioned on the bottom face of the SiC substrate 30. The SiC substrate 30 and the SiC active layer 40 make up a single crystal 4H-SiC {03-38} substrate. A high resistance p-type area (guard ring) 46 is formed at the top of the active layer 40.

A method of fabricating such a diode 60 will now be described. The SiC substrate 30 is created by slicing an ingot grown on the 4H-SiC (000-1) seed crystal by an improved Raleigh method or a CVD method inclined 54.7° in the growth direction, and is mirror polished.

And using this SiC substrate 30 as a seed crystal, the active layer 40, which is a nitrogen doped n-type 4H-SiC, is epitaxial-grown by a CVD method. The donor density of the active layer is about $6 \times 10^{15}$ cm$^{-3}$, and the film thickness is about 16 µm.

The major growth conditions at this time are as follows. The efficiency of introducing such dopant impurities as nitrogen depends on the SiC plane orientation, so when the device is fabricated, the material gas flow rate and the dopant material supply amount during CVD growth must be adjusted according to the plane orientation to be used. The following growth conditions are an example, but conditions are not limited to those stated here.

| | |
|---|---|
| SiH$_4$ flow rate | 0.50 sccm |
| C$_3$H$_8$ flow rate | 0.50 sccm |
| N$_2$ flow rate | $1 \times 10^{-3}$–$4 \times 10^{-3}$ sccm |
| H$_2$ flow rate | 3.0 slm |
| Substrate temperature | 1520° C. |
| Growth time | 240 min |

In the SiC single crystal using a 4H-SiC (0-33-8) substrate fabricated like this, the circular Schottky electrode 52 and the ohmic electrode 54 are created. The Schottky electrode 52 is created on the top face of the active layer 40, and the ohmic electrode 54 is created on the bottom face of the SiC substrate 30. For the Schottky electrode 52, titanium (Ti: 180 nm) can be used, and for the ohmic electrode 54 on the rear face, nickel (Ni: 200 nm) for which thermal treatment at 1000° C. was performed for 20 minutes can be used. To relax the electric field concentration at the edge of the Schottky electrode 52, boron (B) ions are implanted to create a high resistance p-type region 46, and the Schottky diode 60 is completed. Boron ions are implanted at 30 keV–120 keV, for example, and the total dosage is $3 \times 10^{13}$ cm$^{-2}$.

The width of the p-type region where the guard ring is created is 100 µm, and the width of the overlapping part between the p-type region 46 and the Schottky electrode 52 is 10 µm. Ion implantation is performed at room temperature, and heat treatment (annealing) for activating implanted ions is performed under argon gas atmospheric conditions, at 1550° C. for 30 minutes. Photolithography technology can be used to pattern a mask for selective ion implanting and electrode metals.

The diode 60 obtained in this way exhibits high quality, since micro-pipes and stacking faults reach the side face of the SiC active layer 40 and do not reach the surface of the SiC active layer 40, as described above. By using the 4H-SiC {03-38} plane, the flatness of the grown surface improves, and the electric field concentration at the interface of the Schottky electrode and SiC can be decreased.

Here, an example when the SiC single crystal of the present invention is applied to a Schottky diode was described, but it is effective to also use a 4H-SiC {03-38} substrate for a pn junction diode, pin diode and pnpn or npnp thyristor created by epitaxial growth or ion implantation.

EXAMPLES

The SiC single crystal of the present invention and the growth method thereof will now be described specifically by examples.

Example 1

In Example 1, a 4H-SiC single crystal where the (03-38) plane is exposed was used as the seed crystal 30. The pressure inside the reaction tube 8 was maintained at 4 Torr, the temperature of the material 15 was set to about 2300° C., the temperature of the seed crystal was set to about 2250° C., and an SiC single crystal 40 with a 2 inch diameter was bulk-grown on the seed crystal 30. The growth speed at this time was 1 mm/h, and the thickness of the SiC single crystal 40 was 80 mm.

The SiC single crystal 40 grown like this was analyzed by Raman spectroscopic analysis, and it was discovered that the entire surface is a 4H type. Then the bulk of the SiC single crystal 40 was sliced into wafers with about a 330 µm thickness, and was polished by a diamond grinding wheel so as to make the front and rear faces of the wafer mirror faces. By visual inspection, this wafer of the SiC single crystal was homogenous on the entire surface, and poly-crystallization from the edge and polymorphism of crystals did not occur. The wafer was then etched using fused potassium hydroxide and evaluated, and as a result, no micro-pipes and stacking faults were observed on the surface of the wafer.

Example 2

In Example 2, a 4H-SiC single crystal where a plane which is inclined 3° from the (03-38) plane in the direction of the (0001) plane was used as the seed crystal 30. The pressure inside the reaction tube 8 was maintained at 4 Torr, the temperature of the material 15 was set at about 2300° C., the temperature of the seed crystal 30 was set to about 2170° C., and the SiC single crystal 40 with a 2 inch diameter was bulk-grown on the seed crystal 30. The growth speed at this time was 0.8 mm/h, and the thickness of the SiC single crystal 40 was 64 mm. Just like Example 1, the bulk of the SiC single crystal 40 was sliced into wafers, and the wafer was etching and evaluated, and as a result, no micro-pipes and stacking faults were observed.

Example 3

In Example 3, a 4H-SiC single crystal where a plane which is inclined 5° from the (03-38) plane in the direction of the (0001) plane was used as the seed crystal 30. The pressure inside the reaction tube 8 was maintained at 4 Torr, the temperature of the material 15 was set to about 2300° C., the temperature of the seed crystal 30 was set to about 2170° C., and the SiC single crystal 40 with a 2 inch diameter was bulk-grown on the seed crystal 30. The growth speed at this time was 0.8 mm/h, and the thickness of the SiC single crystal 40 was 64 mm. The bulk of the SiC single crystal 40 was sliced into wafers and the wafer was etched and evaluated, and as a result, no micro-pipes and stacking faults were observed.

Example 4

In Example 4, a 4H-SiC single crystal where a plane which is inclined 10° from the (03-38) plane in the direction of the (0001) plane was used as the seed crystal 30. The pressure inside the reaction tube 8 was maintained at 4 Torr, temperature of the material 15 was set at about 2300° C., the temperature of the seed crystal 30 was set to about 2170° C., and the SiC single crystal 40 with a 2 inch diameter was bulk-grown on the seed crystal 30. The growth speed at this time was 0.8 mm/h, and the thickness of the SiC single crystal 40 was 64 mm. The bulk of the SiC single crystal 40 was sliced into wafers, and the wafer was etched and evaluated, and as a result, no micro-pipes and stacking faults were observed.

Comparison Example 1

To compare with the above examples, a 4H-SiC single crystal where the (0001) plane is exposed was used as the seed crystal. The pressure inside the reaction tube was maintained at 4 Torr, the temperature of the material was set to about 2300° C., the temperature of the seed crystal was set to about 2170° C., and the SiC single crystal with a 2 inch diameter was bulk-grown on the seed crystal. The growth speed at this time was 0.6 mm/h, and the thickness of the SiC single crystal was 48 mm. The bulk of the SiC single crystal was sliced into wafers, and the wafer was etched and evaluated, and as a result, stacking faults were not observed, but about 300 micro-pipes/cm$^2$ were observed.

Comparison Example 2

In the comparison example 2, a 4H-SiC single crystal where the (0-101) plane is exposed was used as the seed crystal. The pressure inside the reaction tube was maintained at 4 Torr, the temperature of the material was set to about 2300° C., the temperature of the seed crystal was set to about 2170° C., and the SiC single crystal with a 2 inch diameter was bulk-grown on the seed crystal. The growth speed at this time was 0.8 mm/h, and the thickness of the SiC single crystal 40 was 64 mm. The bulk of the SiC single crystal was sliced into wafers, and the wafer was etched and evaluated, and as a result, micro-pipes were not observed, but 1000 stacking faults/cm$^2$ were observed.

Comparison Example 3

In comparison example 3, a 4H-SiC single crystal where the (11-20) plane is exposed was used as the seed crystal. The pressure inside the reaction tube was maintained at 4 Torr, the temperature of the material was set to about 2300° C., the temperature of the seed crystal was set to about 2170° C., and the SiC single crystal with a 2 inch diameter was bulk-grown on the seed crystal. The growth speed at this time was 0.7 mm/h, and the thickness of the SiC single crystal 40 was 56 mm. The bulk of the SiC single crystal was sliced into wafers, and the wafer was etched and evaluated. As a result, micro-pipes were not observed, but 500 stacking faults/cm$^2$ were observed.

The invention made by the present inventor was described specifically based on the embodiments, but the present invention is not restricted by the above embodiments. For example, the crystal growth system for growing an SiC single crystal is not limited to the one shown in FIG. 1, but various other types can be used.

INDUSTRIAL APPLICABILITY

As described above, in the SiC single crystal of the present invention, micro-pipes and stacking faults are hardly exposed on the surface, and according to the method of growing an SiC single crystal of the present invention, micro-pipes and stacking faults exposed on the surface of the SiC single crystal can be decreased.

What is claimed is:

1. A method of growing of 4H-poly type SiC single crystal, characterized in that a 4H-poly type SiC single crystal is grown on a seed crystal comprised of an SiC single crystal where a {03-38} plane, or a plane which is inclined at an angle α, within about 10°, with respect to the {03-38} plane, is exposed.

2. The method of growing an SiC single crystal according to claim 1, characterized in that said off angle α is within 5°.

3. The method of growing an SiC single crystal according to claim 1, characterized in that said off angle α is within 3°.

4. The method of growing an SiC single crystal according to claim 1, characterized in that said SiC single crystal is grown on said seed crystal by a chemical vapor deposition method.

5. An SiC single crystal, characterized by being grown by a method of growing an SiC single crystal according to claim 1.

6. A method of growing an SiC single crystal for recrystallizing a 4H-poly type SiC single crystal on a seed crystal placed in a crucible made of graphite by sublimating SiC material powder in said crucible, characterized in that an SiC single crystal where a {03-38} plane, or a plane which is inclined at off angle α within about 10° with respect to the {03-38} plane, is exposed, is used as said seed crystal.

7. An SiC single crystal, characterized by being grown by a method of growing an SiC single crystal according to claim 6.

* * * * *